US008263176B2

(12) United States Patent
Herguth et al.

(10) Patent No.: US 8,263,176 B2
(45) Date of Patent: Sep. 11, 2012

(54) METHOD FOR FABRICATING A PHOTOVOLTAIC ELEMENT WITH STABILISED EFFICIENCY

(75) Inventors: Axel Herguth, Constance (DE); Gunnar Schubert, Constance (DE); Martin Käs, Constance (DE); Giso Hahn, Constance (DE); Ihor Melnyk, Constance (DE)

(73) Assignee: Universität Konstanz (DE)

( * ) Notice: Subject to any disclaimer, the term of this patent is extended or adjusted under 35 U.S.C. 154(b) by 469 days.

(21) Appl. No.: 12/225,337

(22) PCT Filed: Mar. 21, 2007

(86) PCT No.: PCT/EP2007/002502
§ 371 (c)(1),
(2), (4) Date: Sep. 18, 2008

(87) PCT Pub. No.: WO2007/107351
PCT Pub. Date: Sep. 27, 2007

(65) Prior Publication Data
US 2010/0243036 A1 Sep. 30, 2010

(30) Foreign Application Priority Data

Mar. 21, 2006 (DE) .................. 10 2006 0120920

(51) Int. Cl.
*B05D 5/06* (2006.01)
(52) U.S. Cl. .......................................... 427/74
(58) Field of Classification Search .......... 427/74
See application file for complete search history.

(56) References Cited

U.S. PATENT DOCUMENTS 4,494,302 A * 1/1985 Knechtli et al. ............. 29/25.02
(Continued)

FOREIGN PATENT DOCUMENTS

WO WO-01/71820 A3 9/2001

OTHER PUBLICATIONS

Lee, Rapid Thermal Processing of Silicon Solar Cells-Passivation and Diffusion, ISE, pp. 1-136, 2003.*

(Continued)

*Primary Examiner* — Michael Cleveland
*Assistant Examiner* — Robert Vetere
(74) *Attorney, Agent, or Firm* — Lerner, David, Littenberg, Krumholz & Mentlik, LLP (57) ABSTRACT

A method for fabricating a photovoltaic element with stabilized efficiency is proposed. The method comprises the following steps: preparing a boron-doped, oxygen-containing silicon substrate; forming an emitter layer on a surface of the silicon substrate; and a stabilization treatment step. The stabilization treatment step comprises keeping the temperature of the substrate during a treatment time within a selectable temperature range having a lower temperature limit of 50° C., preferably 90° C., more preferably 130° C. and even more preferably 160° C. and an upper temperature limit of 230° C., preferably 210° C., more preferably 190° C. and even more preferably 180° C., and generating excess minority carriers in the silicon substrate during the treatment time, for example, by illuminating the substrate or by applying an external voltage. This method can be used to fabricate a photovoltaic element, e.g. a solar cell or a solar module having an efficiency which is stable at a value higher than that of photovoltaic elements fabricated without the stabilization treatment step.

12 Claims, 3 Drawing Sheets

U.S. PATENT DOCUMENTS 5,327,005 A * 7/1994 Granneman .................. 257/443
6,313,398 B1 11/2001 Yamada et al.

OTHER PUBLICATIONS

Lee, "Rapid Thermal Processing of Silicon Solar Cells—Passivation and Diffusion," Institut fur Solare Energiesysteme, pp. 1-173, 2003.*
Ji Youn Lee, "Rapid Thermal Processing of Silicon Solar Cells-Passivation and Diffusion", Fraunhofer Institut Fur Solare Energiesysteme (PHD Thesis), pp. 35-64, Freiburg, 2003 XP002439621.
Hahn, et al., New Crystalline silicon ribbon materials for photovoltaic, J. Phys.: Condens.Matter, vol. 16, pp. R1615-R1648, Dec. 3, 2004.
Bothe, et al., "Performance Degradation of Silicon Solar Cells Triggered by Carrier Recombination", 19th European Photovoltaic Solar Conference, pp. 655-658, Jun. 7-11, 2004, Paris, France.
Bothe et al., "Fast-forming boron-oxygen-related recombination center in crystalline silicon", Applied Physics Letters, vol. 87, 262108-1-262108-3, 2005.
Saitoh et al., "Overview of Light Degradation Research on Crystalline Silicon Solar Cells", Progress in Photovoltaics: research and Applications, vol. 8, pp. 537-547, 2000.
Weizer et al., J. Appl. Phys, 50(6); 4442-4449 (1979).
Glunz et al., Prog. Photovolt: Res. Appl., 7; 463-469 (1999).
Bothe et al., Prog. Photovolt: Res. Appl., 13;287-296 (2005).
Bothe et al., Journal of Applied Physics, 99; 013701-1-013701-11 (2006).

* cited by examiner

METHOD FOR FABRICATING A PHOTOVOLTAIC ELEMENT WITH STABILISED EFFICIENCY

The present invention relates to a method for fabricating a photovoltaic element with stabilised efficiency. In particular, the present invention relates to a method for fabricating a solar cell based on a boron-doped, oxygen-containing silicon substrate or a photovoltaic module in which such solar cells are encapsulated.

Solar cells are used to convert light directly into electrical energy. For this purpose, a region having the correspondingly opposite doping is formed on a p- or n-type semiconductor. A pn junction is produced. On exposure to light, charge carrier pairs are produced, these being spatially separated by the potential gradient formed by the pn junction. The charge carriers separated in this way can then diffuse to a surface of the solar cell and be supplied to an external circuit by metal contacts formed there.

Crystalline silicon is a semiconductor frequently used to fabricate solar cells. A distinction is made between multicrystalline (or polycrystalline) and monocrystalline silicon. Since monocrystalline silicon has no grain boundaries which act as impurities and thus serve as recombination centres, it has a higher material quality compared to multicrystalline silicon, resulting in a higher potential efficiency for solar cells fabricated therefrom. However, as a result of the energy-intensive additional process steps required for drawing the silicon single crystal, the fabrication costs for monocrystalline silicon are higher compared to multicrystalline silicon.

Nowadays, principally two crystal drawing methods are used to fabricate* monocrystalline silicon. Silicon wafers fabricated by the float-zone (FZ) method have the highest quality but are the most expensive and are primarily used in the electronics field. The Czochralski (Cz) method is less expensive and is therefore suitable for use for the mass production of solar cells. In the Czochralski method, silicon is melted in a crucible. A single-crystal seed crystal is brought in contact with the melt and is then drawn upwards by slowly turning away from the melt. In this case, silicon from the melt crystallises on the surface of the (seed) crystal and a cylindrical single crystal is formed, which can typically have a diameter of up to 30 cm and a length of several meters. This single crystal is then cut into wafers about 200-300 µm thick.

Nowadays, Cz silicon of the p-semiconductor type to be used for fabricating solar cells is usually doped with boron due to process technology advantages. For this purpose, boron is dissolved in the silicon melt during the Cz method. As a result of its good solubility behaviour, boron becomes incorporated in the silicon crystal drawn from the melt. A largely homogeneous boron-doped silicon crystal is obtained.

In the conventional Cz method, oxygen is frequently dissolved in the silicon melt, having been released from the crucible which frequently consists of quartz (silicon oxide). The oxygen is likewise incorporated into the silicon crystal.

When a solar cell fabricated from Cz silicon is illuminated and/or an external voltage is applied thereto, excess minority carriers are generated therein and an electric current flows therein. In this case, the oxygen atoms incorporated into the silicon together with the boron atoms used for the doping seem to form defects which may act as electrically active impurities and may negatively influence the electrical properties of the solar cell. As a result of the formation of such defects, the material quality of the Cz silicon substrate deteriorates during the first operating hours of the solar cell and the efficiency of the solar cell drops until it reaches saturation at a certain end value. This phenomenon is designated as "carrier induced degradation" of Cz silicon, it was discovered in 1972 and has been the subject of intensive research until the present day.

At an advantageous boron concentration of about $1*10^{16}$ $cm^{-3}$ and a typical oxygen concentration in Cz silicon of 5 to $10*10^{17}$ $cm^{-3}$, the efficiency of a solar cell under operating conditions typically degrades within a few hours by up to 3% absolute. A loss of 1% absolute frequently observed in Cz silicon solar cells already represents a loss of more than 6% relative at an efficiency of 16.5% which is typical of industrially fabricated solar cells based on Cz silicon prior to degradation. The degradation and therefore the loss of efficiency during the initial operation of the solar cells, is greater the higher the boron and/or the oxygen concentration.

Hitherto in the prior art, substantially two general approaches are known as to how the degradation can be reduced or avoided. The first approach is based on minimising the oxygen contamination of the silicon melts during the Cz method. To this end, the so-called MCz (Magnetic Czochralski) method was developed whereby contact between the silicon melt and quartz crucible is avoided during the production of the crystal by complex magnetic field technology, resulting in a lowering of the oxygen content and therefore a reduction in the degradation. However, as a result of the more complex fabrication, MCz silicon is considerably more expensive than normal Cz silicon.

The other approach is based on reducing the boron concentration in the silicon crystal. Calculations have shown that an optimal efficiency for the solar cell can be achieved by using a silicon substrate having a boron concentration of around $1*10^{16}$ $cm^{-3}$. In order to reduce the considerable degradation which occurs at these boron concentration, Cz silicon substrates having a lower boron concentration are frequently used at the present time in the industrial production of solar cells. As a result, the degradation is reduced and although the efficiency of the solar cell directly after its fabrication is lower than that with a doping of around $1*10^{16}$ $cm^{-3}$, a higher stable efficiency can be achieved after degradation.

In order to completely avoid the problem of degradation, attempts are currently also being made to replace boron by other dopants such as, for example, gallium. However, as a result of its solubility behaviour in silicon, gallium has the decisive disadvantage that a homogeneous distribution in the entire crystal is extremely difficult to achieve. Thus, large quantities of rejects would have to be expected on the industrial scale so that this variant cannot be considered to be feasible industrially so far.

Another procedure involves using phosphorus as dopant and thus using n-type silicon as substrate material. However, such substrate material is unusual in the existing photovoltaic industry and would require a modification of the entire production process.

It has been established that the degradation of Cz silicon is reversible by a so-called annealing step. In such an annealing step the Cz silicon wafer or the ready-processed solar cell is heated for a few minutes to temperatures in the range of around 230° C. It was observed that the original efficiency of the solar cell or the original minority carrier diffusion length in the silicon substrate before degradation can be achieved again through such an annealing step. The boron-oxygen defects formed during the degradation apparently dissolve as a result of the annealing step. We thus talk of metastable defects. However, it was observed that an annealed solar cell degrades again under illumination or when current flows through the cell, i.e. under conditions such as occur as standard, for example, during operation of the solar cell. The annealed state thus appears not to be stable in a solar cell under operating conditions.

For an overview of the effects observed so far in connection with degradation and the attempts at solutions to avoid this made so far, reference is made to Progress in Photovoltaics: Research and Applications, 2000; 8; 537-547.

There may be a need to avoid the problems described above. Particularly, there may be a need to provide a method for fabricating a photovoltaic element in which the efficiency of the photovoltaic element can be stabilised at a high level.

This need may be achieved by a method as defined in claim 1. Advantageous embodiments are specified in the dependent claims.

A method according to the invention for fabricating a photovoltaic element such as, for example, a single solar cell or an entire solar cell module is proposed, comprising the following steps: preparing a boron-doped, oxygen-containing silicon substrate and forming an emitter layer on a surface of the silicon substrate. The method according to the invention is thus characterised in that it comprises an additional stabilisation treatment step, comprising keeping the temperature of the substrate during a treatment time within a selectable temperature range and generating excess minority charge carriers in the silicon substrate during the treatment time. The temperature range in this case has a lower temperature limit of about 50° C. and an upper temperature limit of about 230° C.

The silicon substrate used in the method according to the invention can be a Cz silicon wafer which, for example, is boron-doped with a concentration of about $1*10^{16}$ cm$^{-3}$ to $3*10^{16}$ cm$^{-3}$. Conditional of manufacturing, such a wafer has a specific oxygen concentration of, for example $5*10^{16}$ cm$^{-3}$ to $3*10^{18}$ cm$^{-3}$. However, other boron-doped oxygen-containing silicon substrates can also be used such as, for example, multicrystalline silicon wafers or silicon layers deposited from the gaseous or liquid phase on a supporting substrate.

In order to produce the potential gradient required for the charge carrier separation in a solar cell, according to the invention an emitter is formed on the surface of the silicon substrate. This is a region which usually comprises a semiconductor type opposite to the semiconductor type of the substrate. Boron-doped silicon is usually a p-type semiconductor. The formation of an emitter layer on a substrate surface can be achieved, for example, by superficial in-diffusion of an n-type dopant such as, for example, phosphorus into the substrate. Such diffusion is typically carried out at temperatures above 800° C. However, it is also possible to use other methods for producing an n-doped layer. For example, an additional n-doped layer can be deposited on the substrate surface from a gaseous or liquid phase. Furthermore, the layer must not completely cover the substrate surface. It can be sufficient if only partial region of the substrate surface at the front and/or back of the silicon substrate are covered with the n-doped layer.

Alternatively, the boron-doped silicon substrate can also be an n-type semiconductor, e.g. if it is overcompensated with phosphorus. In this case, the emitter is a p-doped region and can be produced, for example, by in-diffusion or in-alloying of boron or aluminium. The case where the emitter and the substrate are of the same type of semiconductor can also be achieved, for example, if the two regions have highly different band structures so that band bending is established at their interface, which effects the desired potential gradient.

Excess minority carriers can be generated in the silicon substrate during the stabilisation treatment step in various ways, as described in detail further below. For example, in addition to the equilibrium carrier concentration which depends principally on the dopant concentration, excess minority carriers can be generated in the p-type silicon substrate in which electrons are available as minority carriers, by exposure to light or by producing a current through the photovoltaic element by applying an external voltage.

At the same time, i.e., within the treatment time, the temperature of the substrate must be kept within the aforesaid temperature range. With increasing treatment time, the efficiency-stabilising effect successively increases. The longer the treatment time, the higher the efficiency at which the photovoltaic element remains stable in a subsequent operation. In this context, it appears not to be significant if the treatment time is temporarily interrupted. For example, the illumination of the substrate or the application of the external voltage used to generate the excess minority carriers can be temporarily interrupted and resumed at a later time. The temperature can also be temporarily reduced below 50° C. Only the entire duration of the treatment during which the substrate is held in the temperature range and excess minority carriers are generated in the substrate is important for the efficiency-stabilising effect achieved.

It has been established that the desired effect of stabilising the efficiency of the photovoltaic element to be achieved by the method according to the invention can be achieved with increasing substrate temperatures within a shorter treatment time. The lower limit of the temperature is thus preferably selected as 90° C., more preferably 130° C., even more preferably 160° C. It has been further established that as the temperature approaches an upper limit of 230° C., the efficiency stabilising effect is reduced. Thus, the upper temperature limit of the temperature range is preferably selected as 210° C., more preferably 190° C. and even more preferably 180° C.

According to one embodiment, the method according to the invention further comprises a step of forming electrical contacts on the silicon substrate, wherein the step of generating excess minority carriers involves applying an external electrical voltage to the contacts. In other words, electrical contacts are formed on the solar cell to be fabricated and these are then used in turn to apply a voltage to the solar cell. The voltage is preferably applied in the conducting direction of the pn junction formed with the silicon substrate and the n-doped layer. As a result of the applied voltage, minority carriers are thus injected via the space charge region of the pn junction into the region of the respectively opposite semiconductor type. The efficiency-stabilising effect of the method according to the invention increases with increasing voltage in the conducting direction. The voltage can be selected to be higher than 0.4 Volts, preferably higher than the voltage at which the solar cell has its maximum power point in normal operation, for example, higher than 0.6 Volts, and more preferably higher than the open circuit voltage of the solar cell in normal operation, for example, higher than 0.7 Volts. Normal operation of the solar cell should be understood in this connection as operation under standard conditions (25° C., illumination with an AM 1.5 spectrum).

Preferably, the silicon substrate is substantially not illuminated during the application of the external voltage, i.e. in the previously described embodiment in which the excess minority carriers are injected by a current produced by applying an external voltage, the stabilisation treatment step can be carried out in the dark. It is sufficient to heat the solar cells already provided with contacts in the desired temperature range and apply an external voltage to the contacts. Thus, no expensive equipment requiring a large amount of space is required for this embodiment. The solar cells can be stacked one above the other in a space-saving manner in a suitably temperature-controlled room and merely need to be connected to an inexpensive voltage source.

The method is particularly advantageous if it is applied to photovoltaic modules which have already been connected. In this case, a plurality of solar cells are generally interconnected within the module, partly in series and partly in parallel. The module itself can have electrical contacts which are easily contacted from outside. Consequently, it is sufficient to connect the entire module to an external voltage source whose voltage corresponds to the desired voltage to be applied to a single cell multiplied by the number of solar cells connected in series within the module. An embodiment of the present method according to the invention of particular economic interest is thereby possible whereby finished, ready-to-operate solar modules are subjected to the stabilising treatment step before ultimately being delivered to the end consumers by storing them for example in a suitably temperature-controlled room whilst applying the corresponding voltage for a predetermined treatment time. The costs incurred in addition to a normal fabrication method for solar modules by the stabilising treatment step according to the invention are thus minimal. The method according to the invention is therefore economically since a stable efficiency can be achieved for the fabricated solar modules with minimal increased costs, which is about 0.5-2% absolute higher in the long term compared with conventional solar modules which degrade appreciably within the first few operating hours.

According to a further embodiment of the method according to the invention, the step of generating excess minority carriers comprises illuminating the silicon substrate. For example, the silicon substrate can be illuminated from the side which serves as the side facing the sun in the finished solar cell. If the photon energy of the light used for the illumination is higher than the energy band gap of silicon, excess minority carriers are generated in the silicon by the illumination. The illumination is preferably carried out using light at a wavelength of less than 1180 nm and having a radiation intensity higher than 1000 W/m². Conventional lamps such as halogen lamps can thus be used for the illumination.

In this embodiment, it is not necessary for the method according to the invention for the silicon substrate to be contacted electrically. The stabilising treatment step can be carried out, for example, before the electrical contacts are applied to the solar cell. In this case, however, care must be taken to ensure that during the subsequent metallisation no temperatures substantially higher than 200° C. are used which could cancel out the stabilising effect. For example, the metallisation could be carried out by vapour deposition of metal contacts.

According to a further embodiment of the method according to the invention, the treatment time t, measured in minutes, during which the substrate is held within the selectable temperature range is selected according to the following conditions:

$$t \geq \frac{a}{(y+b)^c} * \exp\left(\frac{x}{(T+273)}\right)$$

where T is the average temperature of the selectable temperature range in degrees centigrade during the treatment time, a, b, c and x are constants.

For the case where the stabilising treatment step is carried out whilst applying an external voltage without illuminating the photovoltaic element, y is the current density of the current produced in the cell in A/cm². The treatment time t is preferably selected to that it satisfies the above equation for $a=4.247*10^{-14}$, $b=0.00286$, $c=0.887$ and $x=12550$. Experiments conducted by the applicant have revealed that sufficient stabilisation of the efficiency of the photovoltaic element is achieved with this minimum treatment time. Compared with a conventional, degraded, non-stabilised solar cell, such a stabilised solar cell has an open circuit voltage which is increased by around 50% of the maximum increase in the open circuit voltage attainable by annealing. Even better stabilisation of the efficiency is achieved if the treatment time is selected to be longer so that the above inequality is satisfied for $a=3.272*10^{-14}$, $b=0.00352$, $c=0.934$ and $x=12800$. An approximately 75% increase in the open circuit voltage can thus be achieved.

For the other case where the stabilising treatment step is carried out by illuminating the photovoltaic element and without applying an external voltage, y is the illumination intensity in kW/m². The treatment time t is preferably selected so that it satisfies the above equation for $a=2.298*10^{-11}$, $b=0.399$, $c=1.722$ and $x=11100$. Experiments conducted by the applicant have revealed that sufficient stabilisation of the efficiency of the photovoltaic element is achieved with this minimum treatment time. Compared with a conventional, degraded, non-stabilised solar cell, such a stabilised solar cell has an open circuit voltage which is increased by around 50% of the maximum increase in the open circuit voltage attainable by annealing. Even better stabilisation of the efficiency is achieved if the treatment time is selected to be longer so that the above inequality is satisfied for $a=5.355*10^{-11}$, $b=0.355$, $c=1.349$ and $x=11000$. An approximately 75% increase in the open circuit voltage can thus be achieved.

As has already been mentioned, the efficiency-stabilising effect of the method increases with increasing treatment time. The specified limits for the treatment time t tend to be economically determined limits rather than technically determined limits and were selected so that the best possible efficiency-stabilising effect can be achieved within a treatment time which is acceptable from economic aspects. Studies carried out by the applicant have revealed that satisfactory stabilisation of the efficiency can be achieved at treatment temperatures selected to be correspondingly high, e.g. above 140° C. with treatment times of 30 minutes or, at even higher temperatures, 20 minutes.

From economic aspects, it is desirable for the treatment time to be as short as possible. A lengthening of the stabilising step still produces a slight improvement in the stabilised efficiency but this is no longer in proportion to the increased costs thereby incurred. It is therefore preferable to select the treatment time to be shorter than a day, preferably shorter than five hours and even more preferably shorter than one hour.

According to a further embodiment, the method according to the invention comprises a last high-temperature process step with process temperatures above 230° C., wherein the stabilisation treatment step follows the high-temperature process step. The high-temperature process step can be any process step such as is usually used in the fabrication of photovoltaic elements, in particular solar cells. For example, it can comprise the aforesaid diffusion step to form the n-doped layer. Mostly however, this diffusion step is not the last high-temperature process step. Other processes can follow where, for example, a metallisation process step, in which metal contacts are applied to the silicon substrate and then fired in, can be the last high-temperature process step. In the industrial production of solar cells, metal contacts are frequently printed onto the silicon substrate using a metal-containing paste in the screen printing method and fired into the substrate at temperatures above 600° C. According to present knowledge, for the functioning of the method according to the invention, i.e. for the stabilisation of the efficiency it is necessary or at least favourable that the step of keeping the substrate in the elevated temperature range and simultaneously generating excess minority carriers is carried out after a last high-temperature process step since another high-temperature process step, i.e. heating the substrate to more than 230° C. could cancel out the efficiency-stabilising effect achieved by the treatment. However, it is not important that the treatment time directly follows the last high-temperature step. After the last high-temperature step, initially any other temperature steps can be carried out below 200° C., for example, before the temperature of the substrate is set to the aforesaid temperature range and the excess minority carriers are generated.

According to another embodiment, the method according to the invention comprises a step of encapsulating the silicon substrate in a module, wherein the stabilisation treatment step follows the encapsulation step. In other words, the method is used to fabricate a solar cell module where the ready-processed, ready-to-operate solar cells are encapsulated in a module before they are subjected to the treatment at elevated temperature and the excess minority carrier generation.

This embodiment has the advantage that the stabilising treatment step can be carried out simultaneously for a plurality of solar cells. However, care must be taken to ensure that the temperature range is suitably selected within the stabilising treatment step, i.e. that the module is not damaged. For example, above a temperature of 180° C., the cabling used to connect the individual solar cells can become detached since the solder used liquefies. Temperatures above about 140° C. can damage the module since the EVA laminating film frequently used becomes damaged above such a temperature.

According to a further aspect of the invention, a method for stabilising the efficiency of a photovoltaic element comprising a boron-doped, oxygen-containing silicon substrate is proposed. In this case, a finished conventional photovoltaic element, e.g. a solar cell or an entire solar module is subjected to the stabilising treatment step described above and thereby stabilised at an efficiency which approximately corresponds to the efficiency to be achieved by annealing. The features of the previously described embodiments of the method of fabrication can also be applied appropriately to this stabilising method.

According to yet another aspect of the invention, a photovoltaic element comprising a boron-doped, oxygen-containing silicon substrate is proposed, having an efficiency-stabilised state, wherein the photovoltaic element has a high efficiency such as can be achieved by annealing, where the efficiency of the solar cell drops by less than 5% relatively, preferably less than 2% relatively, under illumination. The photovoltaic element according to the invention can be obtained, for example, by the method of fabrication described above.

Further details, features and advantages of the invention are deduced by the person skilled in the art from the following description of preferred embodiments and the appended figures.

A model which can be used to substantiate the efficiency-stabilising effect achieved by the method according to the invention will be put forward hereinafter with reference to FIG. 1. However, it is noted that exact causal relationships resulting in the efficiency stabilisation achieved by the method according to the invention were not yet understood in detail at the time of writing the present patent application. The proposed model and the measurement results given to support this should thus not in any way restrict the scope of protection as defined by the appended claims.

Hitherto, two different states were known for boron-doped oxygen-containing Cz silicon in a simplified model. The first state given as (A) in FIG. 1 is hereinafter designated as "annealed state". In this state, there appear to be no or very few impurities caused by boron and oxygen, which promote recombination and thus cause a deterioration in the efficiency of a solar cell, or these impurities are electrically inactive. In state (A) oxygen contained in the silicon crystal acts only weakly as a recombination-active centre. Since state (A) is usually measured directly after annealing, i.e. a temperature treatment in the dark which undoes the degradation, this is designated as "annealed".

Figure 1:
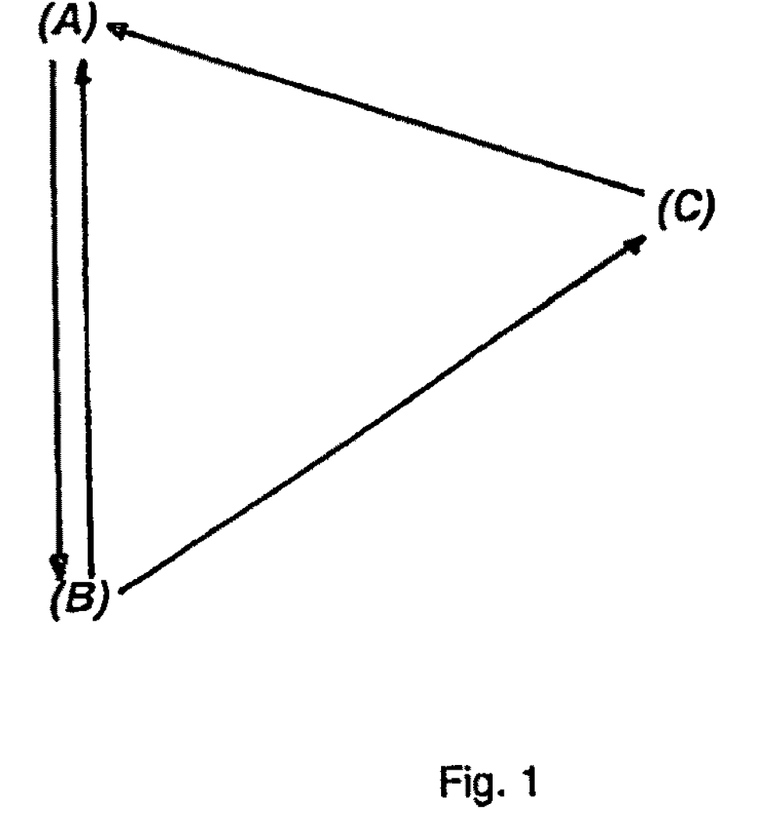
FIG. 1 shows a three-state model with which the operating mode of the method according to the invention may be explained.

The second state given as (B) in FIG. 1 is designated as "degraded state". The degradation is presumably triggered by the formation of a defect in which complexes are formed from interstitial oxygen and substitutional boron. The formation of boron-oxygen complexes takes place under illumination or under current flow in particular at temperatures below 50° C., such as are typical during normal operation of a solar cell. In contrast to state (A), the degraded state (B) exhibits strongly recombination-active impurities which decisively reduce the effective diffusion length of the minority carriers and are thus responsible for the deterioration in the electrical properties of the solar cell.

Studies conducted by the applicant of the present patent application suggest that in addition to these two known states, another state (C) also exists in Cz silicon. This state will be designated hereinafter as "regenerated state". In this state, as in state (A) there appear to be no or very few recombination-active centres or these are electrically inactive. In contrast to the annealed state (A), the regenerated state (C) according to findings so far is stable in time during subsequent operation of the solar cell under illumination or under current flow.

The method according to the invention shows a way of transferring the photovoltaic element from the degraded state (B) to the regenerated state (C) where the electrical properties of the solar cell recover again as far as a level which substantially corresponds to the initial or annealed state (A).

The assumption of an additional third state, i.e. the transition from the hitherto known two-state model to the three-state model put forward here appears to be necessary since studies made by the applicant reveals that the solar cell appears to "know" whether it is in the degradable annealed state (A) or in the stable regenerated state (C). This seems to require that microscopically different states (A) and (C) exist even if no detailed microscopic findings relating to its composition are available for the newly introduced regenerated state (C).

A direct differentiation of states (A) and (C) has not yet been made on account of the similar electrical properties. In order to determine whether states (A) or (C) are present in a Cz silicon crystal or how the two states are divided, all defects in state (A) must be transferred to state (B), i.e. the solar cell must be degraded. If the degraded final state is now compared with that of complete degradation from the annealed state (A) (i.e. after an annealing step at above 200° C.), the deviation is a measure for the population of states (A) and (C).

The individual states (A), (B) and (C) seem to be able to go over partly into one another depending on illumination, current and temperature conditions. In this context, a transition from (A) to (B) is designated as degradation. The inverse transition from (B) to (A) is designated as annealing. A transition from (B) to (C) such as can be achieved by the method according to the invention is designated as regeneration. The inverse transition from (C) directly to (B) has so far not been observed experimentally. According to studies made by the applicant under operating conditions, solar cells fabricated by the method according to the invention were stable over at least 137 h with regard to their efficiency, the efficiency remaining substantially at the level of the annealed state. It is thus assumed that the regenerated state (C) is largely temporally stable. A transition from the regenerated state (C) to the annealed state (A) can be achieved by an annealing step at about 230° C. which is usually carried out for 10 to 30 minutes and is also designated as annealing. The inverse transition from (A) directly to (C) has not yet been observed experimentally.

The reaction path from (A) to (B) (degradation) can be excited by illumination and/or induced current flow but also has a strong temperature dependence. It is therefore described as thermally assisted. According to findings so far, the annealing reactions from (B) to (A) and (C) to (A) are purely thermally activated, i.e. the reaction is intensified with increasing temperature. If no new degradation is forced in this case, the system can be transferred completely to state (A) with a certain temperature-time combination. The regeneration reaction from (B) to (C) appears to be thermally assisted, i.e. it appears to be activated by illumination and/or induced current flow but proceeds considerably more rapidly at higher temperatures.

The transitions between the individual states compete with one another. According to findings so far, which transition dominates depends principally on the temperature conditions and possibly on the concentration of excess minority carriers. Under the conditions such as those selected for the method according to the invention, the transition from the degraded state (B) to the regenerated state (C) dominates. The more the silicon crystal is transferred to state (C), the more extensively the efficiency of a corresponding solar cell is stabilised.

Studies such as those shown hereinafter among others with reference to the graphs plotted in FIGS. 2 and 3 have yielded relationships as to how the efficiency-stabilising effect of the method according to the invention depends on process parameters.

Figure 2:
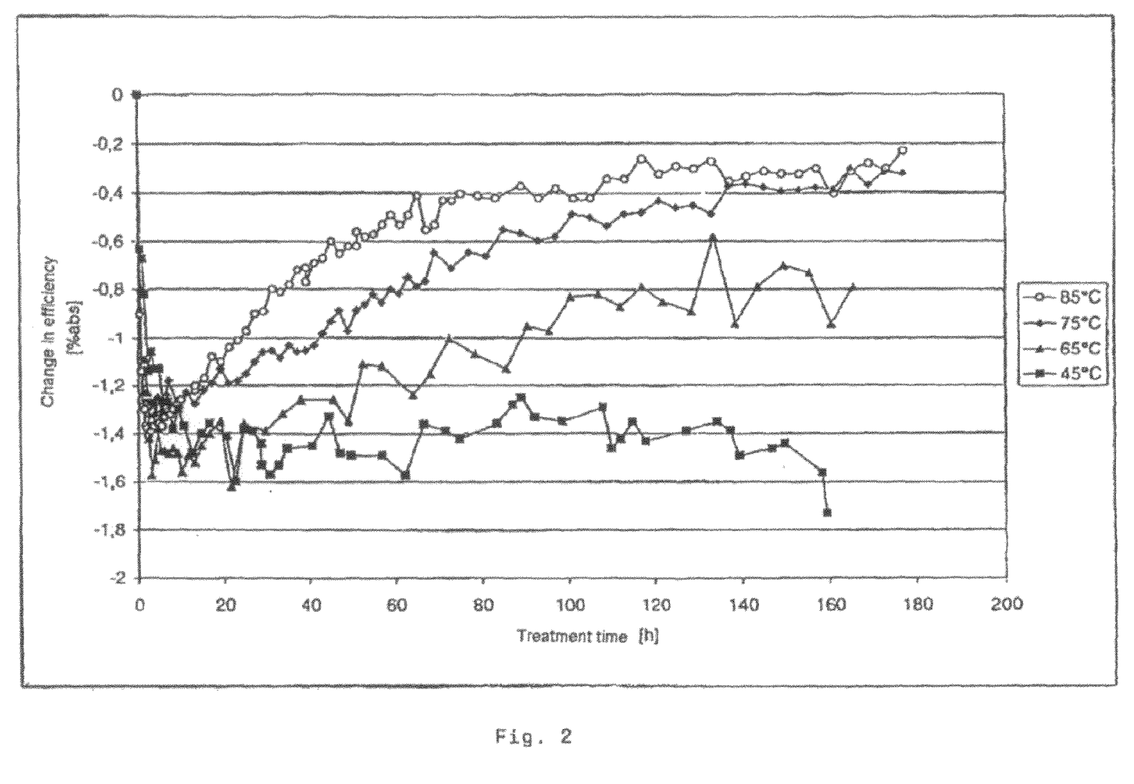
FIG. 2 shows a graph giving the measurement results relating to the change in the absolute efficiency of a solar cell fabricated according to the invention as a function of the treatment time of the stabilising treatment step at various treatment temperatures between 45° C. and 85° C. when a current is induced in the solar cell in the dark.

FIG. 2 shows the loss of efficiency in absolute percent as a function of the treatment time for various temperatures when the solar cell under study is regenerated under a current flow of 20 mA/cm$^2$ in the dark. It can be seen that the degradation effected approximately at zero time and the associated loss of efficiency are approximately recovered again in the course of the regeneration treatment time and the regeneration proceeds faster, the higher the selected regeneration temperature. Further studies have shown that this effect also appears to continue at higher temperatures up to higher than 160° C. No noticeable regeneration was observed at temperatures below 50° C. At 65° C. regeneration proceeds very slowly and even after 160 hours, the loss of efficiency due to the degradation has only approximately halved. Whereas at 85° C., extensive regeneration still requires more than 80 hours, at 110° C. it occurs after only about 2 hours, at 140° C. this time is reduced to about 40 minutes and at 160° C. about 25 minutes was measured (measurements for 110° C., 140° C. and 160° C. are not plotted in FIG. 2).

A similar effect was observed when the solar cell was illuminated with light instead of having current passed through it in the dark as in the case described above. In this case, it was established that the treatment time required to achieve a specific regeneration is substantially proportional to the illumination intensity. A light source which is ten times stronger can approximately accelerate the stabilising treatment process by a factor of 8. The proportionality appears to hold up to an illumination intensity of at least 1000 W/m$^2$, under even stronger illumination the acceleration decreases and appears to reach saturation.

Figure 3:
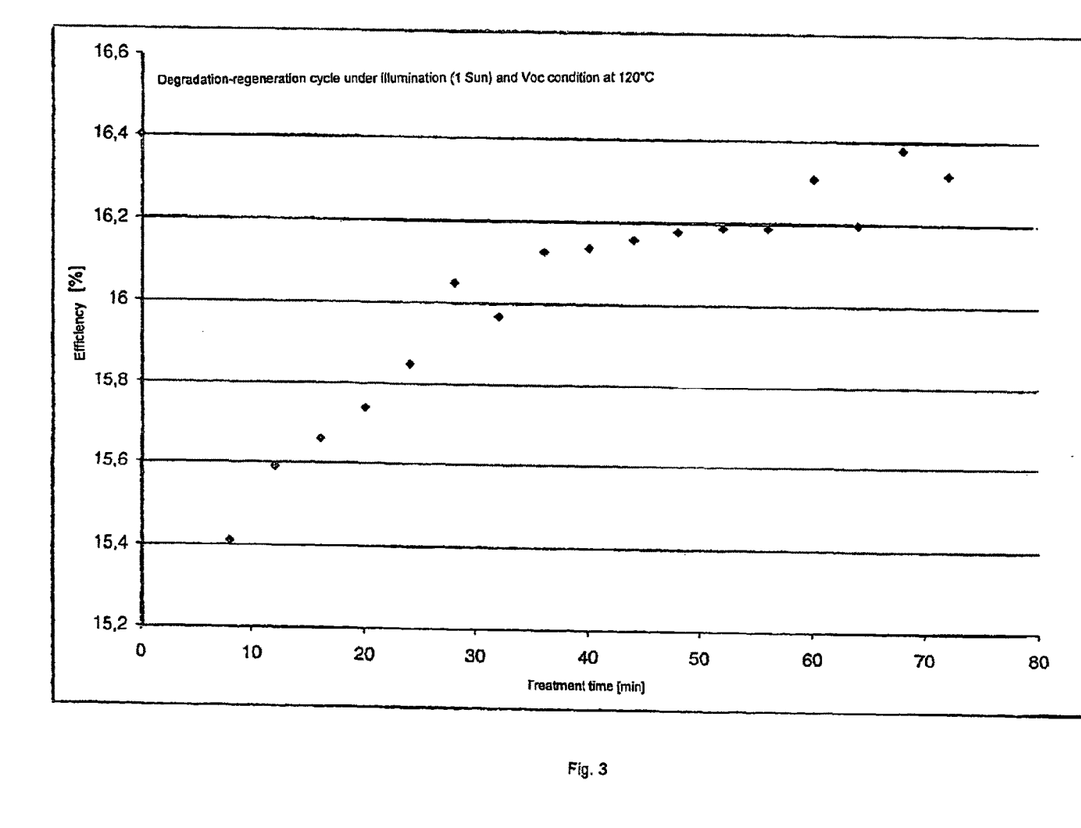
FIG. 3 shows a graph giving the measurement results relating to the change in the efficiency of a solar cell fabricated according to the invention as a function of the treatment time of the stabilising treatment step at a treatment temperature of 120° C. and under illumination of about 1000 W/m² without applying an external voltage.

FIG. 3 shows results of measurements which show the efficiency of a solar cell fabricated according to the invention as a function of the treatment time. The solar cell was illuminated at 120° C. with about 1000 W/m$^2$ using a halogen lamp. No external voltage was applied. It can be seen that almost complete regeneration is achieved after about 35 min.

With regard to the temperature dependence, it was established that the regeneration effect of the method according to the invention appears to decrease from a temperature of about 190° C. This is interpreted at the present time in that from this temperature, the competition due to the transition from the degraded state (B) or from the regenerated state (C) to the degradable annealed state (A) increases and consequently, the system no longer moves principally into the regenerated state (C) but also partly into the non-stable annealed state (A).

Direct regeneration from the annealed state (A) into the regenerated state (C) without the detour via the degraded state (B) has not been observed so far. If a minority carrier excess is brought about in addition to maintaining at elevated temperature (as in the studies shown in FIG. 2 and FIG. 3), it is observed that, starting from an annealed initial state (A), the solar cell initially degrades, but then successively recovers in the further course of the stabilisation treatment step and goes over into the regenerated state (C).

However, the aforesaid operating principle can be used to deduce how it can be determined whether a finished solar cell was fabricated using the method according to the invention: the solar cell fabricated according to the invention is in the efficiency-stabilised regenerated state (C) as described above. However, it can be transferred to the non-stable annealed state (A) by an annealing step at temperatures of about 230° C. If, after such an annealing step, a solar cell under study degrades during subsequent normal operation to an efficiency below the original stable efficiency for the same solar cell, it can thus be ascertained that the solar cell was originally fabricated using the method according to the invention and was stabilised with regard to its efficiency.

Finally, exemplary embodiments of the method according to the invention are described in which the stabilising step was integrated in a conventional method for fabricating a solar cell.

A commercially available Cz silicon wafer is initially subjected to etching and cleaning to remove surface cutting damage produced in the wafer by cutting the Cz silicon crystal. An n-conducting emitter layer is then diffused into the surface of the wafer by POCl$_3$ diffusion. Grid front contacts were then printed onto the emitter layer by screen printing using a silver-containing thick-film paste and a screen of corresponding geometry. After the thick-film paste had dried in a continuous furnace, an aluminium-containing thick-film paste was printed onto the back side of the wafer to form the back contact. Both the front and the back contact are then fired into the wafer surface at a temperature between 700 and 900° C. in a continuous furnace. After this last high-temperature step, the solar cell is in principle ready to operate, i.e. it has the pn junction required to separate charge carrier pairs generated by light and front and back contacts to transport the charge carrier pairs thus separated.

The ready-to-operate solar cell is now subjected to the stabilising treatment step according to the invention. In this case, the solar cell is placed on a hot plate and heated, for example, to a temperature of 160° C. At the same time, the solar cell is illuminated by a halogen lamp on its front side, thus generating excess minority carriers in the solar cell. The solar cell is held in this state for about 30 minutes. It can then cool down and be supplied to further processing, e.g. wiring and encapsulation in modules.

In an alternative embodiment, the ready-to-operate solar cell is connected in series with other solar cells via contact strips soldered onto its front and back contacts and encapsulated into a module using an EVA film (ethylene vinyl acetate). The contact strips are electrically connected to connections for the module. The connections of the module are then connected to an external voltage source whose voltage is selected such that a voltage of about 0.7 Volts is applied to each of the solar cells connected in series. The modules thus set under voltage are then stored for about one hour in a suitably heated room at, for example, 140° C.

The invention claimed is:

1. A method for fabricating a photovoltaic element with stabilized efficiency, comprising the following steps:
   providing a boron-doped, oxygen-containing silicon substrate;
   forming an emitter layer on a surface of the silicon substrate;
   forming electrical contacts on the silicon substrate;
   performing stabilization treatment, comprising:
   maintaining the temperature of the substrate during a treatment time t within a selectable temperature range having a lower temperature limit of 50° C. and an upper temperature limit of 230° C.; and
   generating excess minority charge carriers in the silicon substrate during the treatment time;
   wherein the step of generating excess minority carriers involves applying an external electrical voltage to the contacts;
   wherein the treatment time t in minutes during which the substrate is held within the selectable temperature range is given by:

$$t \geq \frac{a}{(y+b)^c} * \exp\left(\frac{x}{(T+273)}\right)$$

where T is the average temperature of the selectable temperature range in ° C. during the treatment time, y is the current density through the photovoltaic element brought about by the applied voltage in A/cm2 and $a=4.247*10^{-14}$, $b=0.00286$, $c=0.887$ and $x=12550$.

2. The method according to claim 1, wherein the voltage is applied in the conducting direction of the pn junction formed with the silicon substrate and the emitter layer.

3. The method according to claim 1, wherein the applied voltage is higher than 0.4 V.

4. The method according to claim 1, wherein the silicon substrate is not illuminated during the application of the external voltage.

5. A method for fabricating a photovoltaic element with stabilized efficiency, comprising the following steps:
   providing a boron-doped, oxygen-containing silicon substrate;
   forming an emitter layer on a surface of the silicon substrate;
   performing stabilization treatment, comprising:
   maintaining the temperature of the substrate during a treatment time t within a selectable temperature range having a lower temperature limit of 50° C. and an upper temperature limit of 230° C.; and
   generating excess minority charge carriers in the silicon substrate during the treatment time;
   wherein the step of generating excess minority carriers comprises illuminating the silicon substrate;
   wherein the treatment time t in minutes during which the substrate is held within the selectable temperature range is given by:

$$t \geq \frac{a}{(y+b)^c} * \exp\left(\frac{x}{(T+273)}\right)$$

where T is the average temperature of the selectable temperature range in ° C. during the treatment time, y is the radiation intensity in kW/m² and $a=2.298*10^{-11}$, $b=0.399$, $c=1.722$ and $x=11100$.

6. The method according to claim 5, wherein the illumination takes place using light having a wavelength shorter than 1180 nm.

7. The method according to claim 5, wherein the illumination takes place using light having a radiation intensity higher than 10 W/m².

8. The method according to claim 1 or claim 5, further comprising a last high-temperature process step with process temperatures above 230° C., wherein the stabilization treatment step follows the high-temperature process step.

9. The method according to claim 1 or claim 5, further comprising a step of encapsulating the silicon substrate in a module, wherein the stabilization treatment step follows the encapsulation step.

10. The method according to claim 1 or claim 5, wherein the lower temperature limit is 90° C. and wherein the upper temperature limit is 210° C.

11. A method for stabilizing the efficiency of a photovoltaic element comprising a boron-doped, oxygen-containing silicon substrate, comprising the steps:
   maintaining the temperature of the photovoltaic element during a treatment time t within a selectable temperature range having a lower temperature limit of 50° C. and an upper temperature limit of 230° C.; and
   generating excess minority carriers in the photovoltaic element during the treatment time;
   wherein the step of generating excess minority carriers comprises illuminating the photovoltaic element;

wherein the treatment time t in minutes during which the substrate is held within the selectable temperature range is given by:

$$t \geq \frac{a}{(y+b)^c} * \exp\left(\frac{x}{(T+273)}\right)$$

where T is the average temperature of the selectable temperature range in ° C. during the treatment time, y is the radiation intensity in kW/m² and a=2.298*10⁻¹¹, b=0.399, c=1.722 and x=11100.

12. A method for stabilizing the efficiency of a photovoltaic element comprising a boron-doped, oxygen-containing silicon substrate, comprising the steps:

maintaining the temperature of the photovoltaic element during a treatment time t within a selectable temperature range having a lower temperature limit of 50° C. and an upper temperature limit of 230° C.; and generating excess minority carriers in the photovoltaic element during the treatment time;

wherein the step of generating excess minority carriers involves applying an external electrical voltage to electrical contacts of the photovoltaic element;

wherein the treatment time t in minutes during which the substrate is held within the selectable temperature range is given by:

$$t \geq \frac{a}{(y+b)^c} * \exp\left(\frac{x}{(T+273)}\right)$$

where T is the average temperature of the selectable temperature range in ° C. during the treatment time, y is the current density through the photovoltaic element brought about by the applied voltage in A/cm2 and a=4.247*10⁻¹⁴, b=0.00286, c=0.887 and x=12550.

* * * * *

UNITED STATES PATENT AND TRADEMARK OFFICE
CERTIFICATE OF CORRECTION

| | | |
|---|---|---|
| PATENT NO. | : 8,263,176 B2 | Page 1 of 1 |
| APPLICATION NO. | : 12/225337 | |
| DATED | : September 11, 2012 | |
| INVENTOR(S) | : Axel Herguth et al. | |

It is certified that error appears in the above-identified patent and that said Letters Patent is hereby corrected as shown below:

On the Title Page:

Item (75) Inventors, the city of all the inventors, "Constance" should read -- Konstanz --.

Signed and Sealed this
Twenty-eighth Day of January, 2014

Michelle K. Lee
*Deputy Director of the United States Patent and Trademark Office*